US006762965B2

(12) United States Patent
Benedix et al.

(10) Patent No.: US 6,762,965 B2
(45) Date of Patent: Jul. 13, 2004

(54) METHOD FOR INTEGRATING IMPERFECT SEMICONDUCTOR MEMORY DEVICES IN DATA PROCESSING APPARATUS

(75) Inventors: Alexander Benedix, München (DE); Reinhard Dueregger, Poing (DE); Wolfgang Ruf, Friedberg (DE)

(73) Assignee: Infineon Technologies AG, Munich (DE)

( * ) Notice: Subject to any disclaimer, the term of this patent is extended or adjusted under 35 U.S.C. 154(b) by 95 days.

(21) Appl. No.: 10/254,694

(22) Filed: Sep. 25, 2002

(65) Prior Publication Data

US 2003/0058711 A1 Mar. 27, 2003

(30) Foreign Application Priority Data

Sep. 25, 2001 (DE) .......................................... 101 47 138

(51) Int. Cl.[7] ................................................. G11C 7/00
(52) U.S. Cl. ................... 365/201; 365/200; 365/230.01
(58) Field of Search ................................. 365/200, 201, 365/230.01, 189.07

(56) References Cited

U.S. PATENT DOCUMENTS

| 4,939,694 | A | | 7/1990 | Eaton et al. | |
| 5,835,430 | A | | 11/1998 | Henning et al. | |
| 5,983,320 | A | * | 11/1999 | Farmwald et al. | 711/114 |
| 6,097,098 | A | * | 8/2000 | Ball | 257/786 |

* cited by examiner

Primary Examiner—Thong Q. Le
(74) Attorney, Agent, or Firm—Laurence A. Greenberg; Werner H. Stemer; Ralph E. Locher

(57) ABSTRACT

A method for integrating imperfect semiconductor memory devices having functional and defective memory cells into a data processing apparatus. The defective memory cells are assigned defect addresses or defect address ranges. Before a memory access of the data processing apparatus is carried out, the address of the memory access is compared with the defect addresses or defect address ranges and is recoded in the event of correspondence.

12 Claims, 2 Drawing Sheets

METHOD FOR INTEGRATING IMPERFECT SEMICONDUCTOR MEMORY DEVICES IN DATA PROCESSING APPARATUS

BACKGROUND OF THE INVENTION

Field of the Invention

The invention relates to a method for integrating at least one semiconductor memory device having functional and defective memory cells (an imperfect semiconductor memory device hereinafter) into a data processing apparatus. The invention also relates to a configuration in an imperfect semiconductor memory device that simplifies such an integration.

In the fabrication of today's customary semiconductor memory devices, the large number of individual memory cells in the semiconductor memory device in conjunction with a demanding production process leads to high losses in yield.

The losses in yield are combated nowadays by various redundancy contents that enable a defect-free semiconductor memory device to be emulated outside the memory device, for instance, by providing redundant memory cells that replace defective memory cells by using optically or electrically programmable connecting devices (fuses, antifuses).

Redundancy concepts based on optically programmable connecting devices have hitherto been able to be used only at the wafer level. The effect remains limited to the replacement of defective memory cells that can be identified at the wafer level.

An obstacle to redundancy concepts with electrically programmable connecting devices is an increased production outlay, if for example, production steps outside or in addition to a standard production process of the semiconductor memory device are necessary.

The effect of the customary redundancy concepts is always limited since only limited space for redundant memory cells and for connecting and logic devices required for activating the redundant memory cells is available in the semiconductor memory device. The concepts are insufficient if the number of defective memory cells is very large or if the defective memory cells occur in unfavorably bundled groups.

Moreover, with increasing utilization of redundancy structures, the probability that the redundant structures themselves will have defects rises.

Overall, the effect of previous redundancy concepts remains limited. They increase the production yield only to an inadequate extent even though the absolute number of defective memory cells is small in relation to the total number of memory cells situated in the semiconductor memory device.

Continually rising integration with an increased total number of memory cells per semiconductor memory device and the increasingly more complex production processes mean that the production yield of outwardly defect-free semiconductor memory devices can be expected to continually decrease.

During the production of semiconductor memory devices that outwardly appear to be defect-free, a large number of virtually defect-free semiconductor memory devices (imperfect semiconductor memory devices) with a very small number of defective, irreparable memory cells in relation to the total number of memory cells are obtained. Since customary data processing apparatuses that use semiconductor memory devices have hitherto always presupposed defect-free semiconductor memory devices, such imperfect semiconductor memory devices are unusable at the present time.

SUMMARY OF THE INVENTION

It is accordingly an object of the invention to provide a method that can be used to integrate semiconductor memory devices, which have defective memory cells that cannot be completely replaced by functional memory cells, into data processing apparatuses. It is likewise an object of the invention to provide a configuration in a semiconductor memory device that will enable the semiconductor memory device to be used with such a method.

With the foregoing and other objects in view there is provided, in accordance with the invention, a method for integrating at least one imperfect semiconductor memory device in a data processing apparatus. The method includes steps of: assigning an operating address range to the semiconductor memory device; assigning defect addresses in the operating address range to defective memory cells of the semiconductor memory device; storing the defect addresses in a defect memory; before an instruction processing unit of the data processing apparatus accesses an address in the operating address range, comparing the address to be accessed with the defect addresses; and if the address to be accessed corresponds with one of the defect addresses, recoding the address to be accessed to a replacement address.

In accordance with an added mode of the invention, the method includes steps of: providing the instruction processing unit of the data processing apparatus with a pipeline structure and an address processing unit; using the address processing unit to compare an address contained in a control instruction being shifted through said pipeline structure with the defect addresses, the address to be accessed being the address contained in the control instruction; and if the address contained in the control instruction corresponds with one of the defect addresses, using the address processing unit to recode the address contained in the control instruction into a replacement address before the control instruction is executed.

In accordance with an additional mode of the invention, the method includes steps of: linearizing the operating address range of the semiconductor memory device so that at least one continuous defect-free address range and at least one defect address range are produced in the operating address range; and using the address processing unit to perform testing according to address ranges.

In accordance with another mode of the invention, the method includes: providing at least one semiconductor memory device on a memory module having a non-volatile memory device; and storing defect data, namely the defect addresses or defect address ranges in the non-volatile memory device during a test cycle of the memory module such that the non-volatile memory device defines the defect memory.

In accordance with a further mode of the invention, the method includes steps of: providing non-volatile memory cells in the semiconductor memory device; and storing defect data, namely the defect addresses or defect address ranges in the non-volatile memory cells during a test cycle of the semiconductor memory device.

With the foregoing and other objects in view there is also provided, in accordance with the invention, a configuration in a semiconductor memory device. The configuration includes: a plurality of functional memory cells and a plurality of defective memory cells; a plurality of connection devices; a plurality of external address lines connected to the plurality of the connection devices; a plurality of internal address lines connected to the plurality of the functional memory cells and the plurality of the defective memory cells; and a programmable address decoder for assigning ones of the plurality of the internal address lines connected to the plurality of the functional memory cells to the plurality of the external address lines such that at least one continuous address range is formed from the plurality of the functional memory cells.

In accordance with an added feature of the invention, there is provided, a plurality of redundant memory cells associated with ones of the plurality of the internal address lines; and a standard memory cell array including the plurality of the functional memory cells and the plurality of the defective memory cells. The programmable address decoder is for recoding the ones of the plurality of the internal address lines associated with the plurality of the redundant memory cells to addresses corresponding to the plurality of the defective memory cells to obtain the at least one continuous address range. The addresses corresponding to the plurality of the defective memory cells are in an operating address range.

In accordance with an additional feature of the invention, there is provided, a standard memory cell array including the plurality of the functional memory cells and the plurality of the defective memory cells. The programmable address decoder is also for replacing the plurality of the defective memory cells by the plurality of the functional memory cells to obtain the at least one continuous address range.

In accordance with another feature of the invention, there are provided, optically programmable connecting devices for programming the address decoder depending on a test result determining defective addresses.

In accordance with a further feature of the invention, the optically programmable connecting devices can be programmed after the semiconductor memory device has been housed.

In accordance with a further added feature of the invention, the semiconductor memory device is a DRAM.

In accordance with another added feature of the invention, the semiconductor memory device includes a DRAM.

Thus, in the method for integrating defective semiconductor memory devices in data processing apparatuses, semiconductor memory devices are each assigned an operating address range, and addresses of defective memory cells are determined and stored as defect addresses in a non-volatile defect memory.

Afterward, the semiconductor devices and the defect memory are incorporated into the data processing apparatus. The data processing apparatus reads the defect addresses from the defect memory. Subsequently, before each access of the data processing apparatus into the operating address range of the semiconductor memory device, a sequence controller in the data processing apparatus checks whether an access to one of the defect addresses is imminent. If such an access is imminent, it is recoded to a replacement address in a suitable manner before the actual memory access is effected.

The recoding of imminent accesses to defect addresses to replacement addresses can be effected in the data processing apparatus by using various mechanisms, for instance by using a fail table or an interrupt.

A preferred embodiment of the method uses the fact that customary data processing apparatus have instruction processing units with pipeline structures.

In this case, a group of successive control instructions is present in the pipeline structure of the instruction processing unit of the data processing apparatus. The control instruction currently situated at a head end of the pipeline is being executed and the subsequent control instructions in the pipeline has already been subjected to pre-processing, for instance, by a branch processing unit (BPU).

In a similar manner, parts of the control instructions that contain addresses in the operating address range of the semiconductor memory device are tested and processed by an address processing unit within the instruction processing unit.

In this case, the testing can be effected, for example, for all of the defect addresses simultaneously by using comparator devices that are connected in parallel and whose comparison registers are loaded with the defect addresses beforehand.

With a rising number of defective memory cells, the complexity for testing an address from the instruction processing unit with respect to all of the defect addresses rises in the case of this realization.

In an advantageous manner, the complexity at this point, that is to say the number of comparisons, is limited by creating, within the operating address range of the semiconductor memory device, at least one continuous defect-free address range (linearized address range hereinafter), and outside the defect-free address ranges, at least one defect address range.

Depending on the configuration of the semiconductor memory devices (serial or parallel), at best only one comparison operation is then necessary for a semiconductor memory device or a group of semiconductor memory devices in order to check whether the address of the memory access lies within or outside a defect address range of the semiconductor memory device. A distance (offset) between the address of the access and a bottommost address of a defect address range of the semiconductor memory device can then serve as a pointer in a replacement memory space that is reserved for this purpose elsewhere in dependence on a total defect address range in the data processing apparatus.

If the semiconductor memory devices are DRAMs (dynamic random access memories) and are configured on memory modules, then the defect addresses are preferably stored in the EEPROM (electrically erasable programmable read only memory) situated on the memory module.

However, it is also possible to create, in the semiconductor memory device, a non-volatile memory area for receiving the defect addresses, either in the address range of the semiconductor memory device or, for instance, in a non-volatile register set of the semiconductor memory device that is accessible via a special mode.

If continuous defect-free, linearized address ranges are to be created in an imperfect semiconductor memory device, then to that end, a configuration of the type according to the invention is necessary on the semiconductor memory device.

Such a configuration is preferably a programmable address decoder that makes it possible to combine, in a suitable manner, internal address lines connected to the memory cells with external address lines connected to connection devices of the semiconductor memory device.

This combination can be effected through a variation of customary redundancy concepts as follows: gaps resulting from defective memory cells in a standard memory cell array are filled from a supply of redundant memory cells, proceeding from a lower address, provided that the supply of redundant memory cells is sufficient. In this case, the difference from existing redundancy concepts is that it is indeed not absolutely necessary to replace every defective memory cell in order to obtain a serviceable semiconductor memory device. Rather, the semiconductor memory device is always serviceable and at the same time, has a memory size that results from the topmost address up to which a continuous defect-free address space was created.

What is disadvantageous about such a conception of a programmable address decoder is that either a high number of redundant memory cells must be provided or it is necessary to accept a relatively large memory loss in the semiconductor memory device.

In its preferred embodiment, the address decoder recodes the standard memory cell array such that addresses of defective memory cells are replaced by functional memory cells from the standard memory cell array itself. In this case, during the programming of the address decoder, care is taken to ensure that one or more continuous defect-free address ranges are produced in the operating address range of the semiconductor memory device. In contrast to the first solution, in which the number of redundant memory cells and thus also the number of replaceable defective memory cells is limited, in this solution, all of the memory cells situated on the semiconductor memory device are available for recoding. What is disadvantageous is that the address decoder will be provided in more complex fashion as compared with the first solution.

The address decoder is programmed in a manner dependent on defect addresses that are determined during a test cycle, preferably by using optical fuses and antifuses as programmable connecting devices. This type of programming can be realized in a particularly reliable manner using the customary devices in semiconductor process technology.

In this case, in a particularly preferred manner, optical fuses are used that can also be programmed after the semiconductor memory device has been housed. In this case, the programming of the address decoder can be effected or altered at the end of reliability tests. As a result, it is possible to increase the total yield of imperfect semiconductor memory devices with continuous defect-free address ranges.

It is equally possible to optimize the yield with regard to different specification features. By way of example, a higher yield of semiconductor memory devices having faster specification can be obtained by replacing slower memory cells by faster memory cells using the programmable address decoder.

It is equally possible in this way to increase the yield of semiconductor memory devices with lower refresh rates by replacing memory cells with lower retention performance by memory cells with a higher retention performance.

Other features which are considered as characteristic for the invention are set forth in the appended claims.

Although the invention is illustrated and described herein as embodied in a method for the integration of imperfect semiconductor memory devices in data processing apparatuses, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
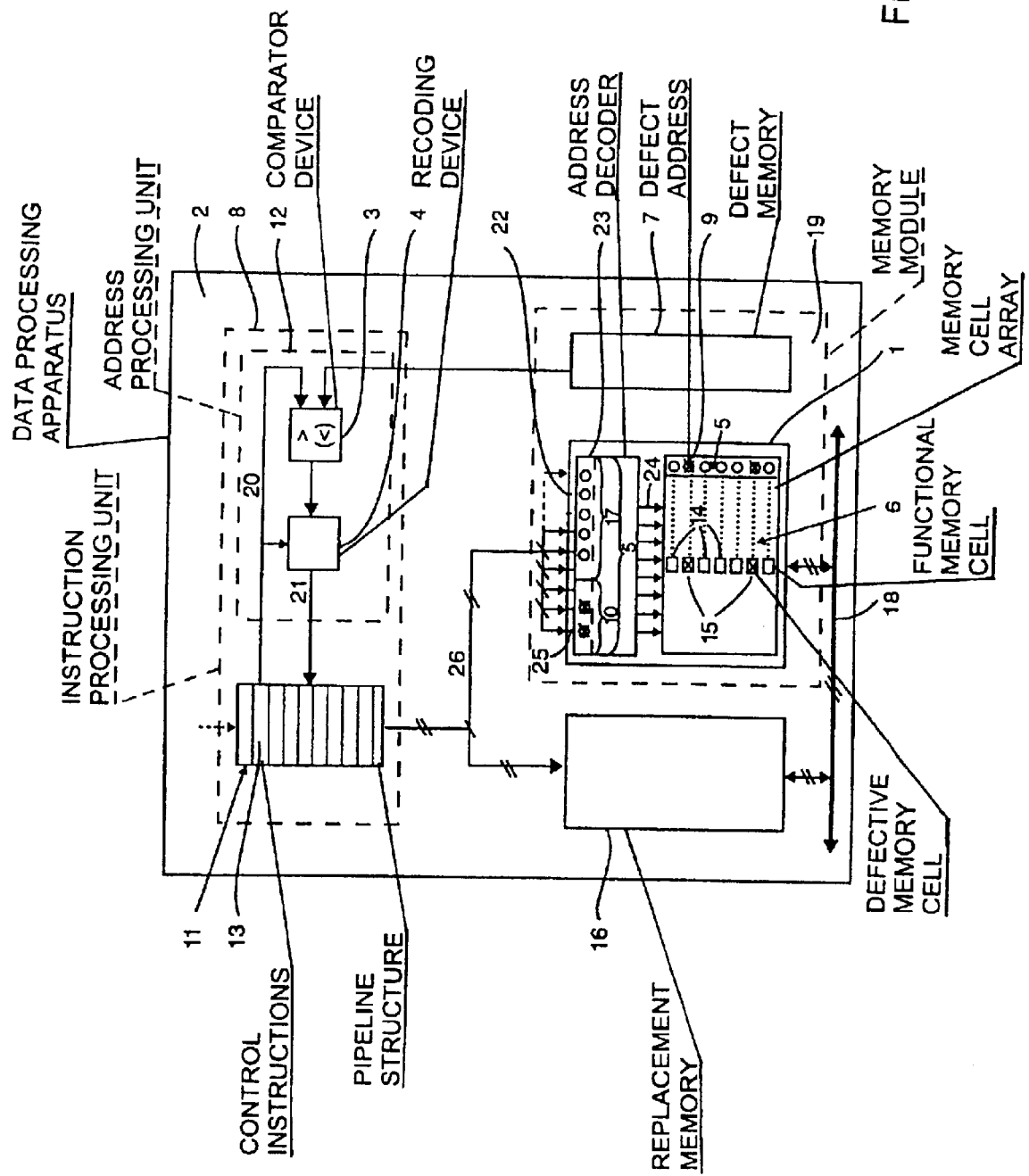
FIG. 1 is a block diagram of semiconductor memory device that has been incorporated into a data processing apparatus.

Referring now to the figures of the drawing in detail and first, particularly, to FIG. 1 thereof, there is shown an exemplary embodiment of the invention in which a semiconductor memory device 1 has been integrated into a data processing apparatus 2. The inventive method will be explained using the exemplary embodiment shown in FIG. 1.

In the embodiment illustrated, the inventive method additionally requires an instruction processing unit 8 with a pipeline structure 11 for control instructions 13 that will be executed. The control instructions 13 are shifted through the pipeline structure 11, and they can be processed before they are actually executed.

In a standard memory cell array 6 assigned to an operating address range 5, the semiconductor memory device 1 has functional memory cells 14 and defective memory cells 15 assigned to defect addresses 9. In this case, memory cell hereinafter denotes a jointly addressable group of memory elements.

Internal address lines 24 are connected to the memory cells 14, 15. A control and address bus 26 of the data processing apparatus 2 is connected to connection devices 22 of the semiconductor memory device 1. Within the semiconductor memory device 1, external address lines 25 lead to the connection devices 22.

In the exemplary embodiment illustrated, the semiconductor memory device 1 has a programmable address decoder 23. The address decoder 23 assigns the internal address lines 24 to the external address lines 25 such that a continuous defect-free address range 17 and a defect address space 10 are produced within the operating address range 5 of the semiconductor memory device 1.

In this case, the defect address space 10 may also contain functional memory cells 14 which, for instance through limited resources of the address decoder 23, cannot be added to the continuous defect-free address range 17.

For simplified illustration, the figure shows only a single continuous functional address range 17. However, for instance, due to limited resources of the address decoder 23, solutions with a plurality of respective continuous defect-free ranges 17 are also possible.

The defect addresses 9 or the defect address ranges 10 are stored in non-volatile form in a defect memory 7. In this example, the defect memory 7 is situated outside the semiconductor memory device 1 together with it on a memory module 19.

Furthermore, in the example, a replacement memory 16 is provided outside the semiconductor memory device 1. However, the replacement memory 16 may also be situated in the semiconductor memory device 1 itself. Like the semiconductor memory device 1, the replacement memory 16 is connected to a data bus 18 and to the control and address bus 26.

In accordance with the exemplary embodiment of the inventive method, the semiconductor memory device 1 has defective memory cells 15. The programmable address decoder 23 sorts functional memory cells 14 of the semiconductor memory device 1 in such a way that a continuous defect-free address range 17 is produced for addressing via the control and address bus 26.

The information about the defect address range 10 is stored at the end of a test cycle for the memory module 19 in the defect memory 7.

With the content of the defect memory 7, comparison registers of a comparator device 3 are loaded in an address processing unit 12 within the instruction processing unit 8 of the data processing apparatus 2.

Afterward, all of the control instructions 13 shifted through the pipeline structure 11 of the instruction processing unit 8 are checked with respect to whether the control instructions 13 contain memory accesses (access addresses) 20 into the operating address range 5 of the semiconductor memory device 1.

If such an access is present, then the access address 20 is checked in the comparator device 3 with respect to whether it is contained in a defect address range 10. If the access address 20 lies in a defect address range 10, then it is subsequently recoded to a replacement address 21 in a recoding device 4. The replacement address 21 subsequently replaces the address 20 in the control instruction 13.

Figure 2:
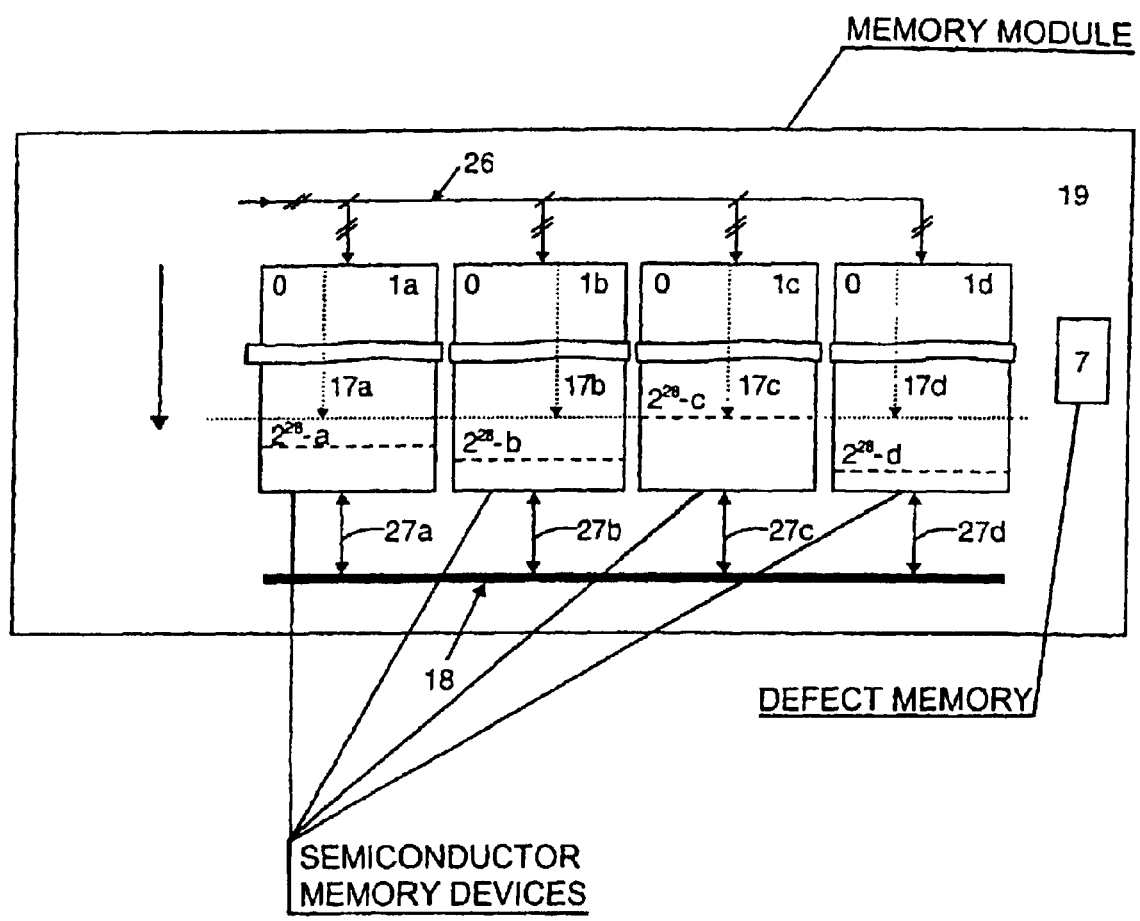
FIG. 2 is a block diagram of a memory module with four semiconductor memory devices.

FIG. 2 shows a memory module 19 with four semiconductor memory devices 1a, 1b, 1c, 1d. Each of these semiconductor memory devices 1a–1d provides a data bus 27a–27d having a width of 16 bits for a data bus 18 having a width of 64 bits in total in this example.

None of the semiconductor memory devices 1a–1d specified for $2^{28}$ memory locations actually has the specified address range. The semiconductor memory device 1a, 1b, 1c and 1d actually has an address range 17a–17d which is reduced by a, by b, by c and by d, respectively, but is in each case continuously functional with regard to addressing via a control and address bus 26. Overall, given c>a>b>d, only an address range: $2^{28}$–c can be addressed, since the four semiconductor memory devices 1a–1d are addressed in parallel in this example.

The value for c, or $2^{28}$–c, can be stored in the defect memory 7, likewise situated on the memory module 19.

A sequence controller in the data processing apparatus 1 reads out this value and thereby loads one of a plurality of comparison registers of a comparator device 3 which monitors successive control instructions 13 in a pipeline structure 11 of an instruction execution unit 8 of the data processing apparatus 2 with regard to addresses contained in the memory instructions 13.

We claim:

1. A method for integrating at least one imperfect semiconductor memory device in a data processing apparatus, the method which comprises:

assigning an operating address range to the semiconductor memory device;

assigning defect addresses in the operating address range to defective memory cells of the semiconductor memory device;

storing the defect addresses in a defect memory;

before an instruction processing unit of the data processing apparatus accesses an address in the operating address range, comparing the address to be accessed with the defect addresses; and if the address to be accessed corresponds with one of the defect addresses, recoding the address to be accessed to a replacement address.

2. The method according to claim 1, which comprises:

providing the instruction processing unit of the data processing apparatus with a pipeline structure and an address processing unit;

using the address processing unit to compare an address contained in a control instruction being shifted through said pipeline structure with the defect addresses, the address to be accessed being the address contained in the control instruction; and if the address contained in the control instruction corresponds with one of the defect addresses, using the address processing unit to recode the address contained in the control instruction into a replacement address before the control instruction is executed.

3. The method according to claim 2, which comprises:

linearizing the operating address range of the semiconductor memory device so that at least one continuous defect-free address range and at least one defect address range are produced in the operating address range; and using the address processing unit to perform testing according to address ranges.

4. The method according to claim 1, which comprises:

providing at least one semiconductor memory device on a memory module having a non-volatile memory device; and storing defect data selected from a group consisting of the defect addresses and defect address ranges in the non-volatile memory device during a test cycle of the memory module such that the non-volatile memory device defines the defect memory.

5. The method according claim 1, which comprises:

providing non-volatile memory cells in the semiconductor memory device; and storing defect data selected from a group consisting of the defect addresses and defect address ranges in the non-volatile memory cells during a test cycle of the semiconductor memory device.

6. A configuration in a semiconductor memory device, the configuration comprising:

a plurality of functional memory cells and a plurality of defective memory cells;

a plurality of connection devices;

a plurality of external address lines connected to said plurality of said connection devices;

a plurality of internal address lines connected to said plurality of said functional memory cells and said plurality of said defective memory cells; and a programmable address decoder for assigning ones of said plurality of said internal address lines connected to said plurality of said functional memory cells to said plurality of said external address lines such that at least one continuous address range is formed from said plurality of said functional memory cells.

7. The configuration according to claim 6, comprising:

a plurality of redundant memory cells associated with ones of said plurality of said internal address lines; and a standard memory cell array including said plurality of said functional memory cells and said plurality of said defective memory cells;

said programmable address decoder being for recoding said ones of said plurality of said internal address lines associated with said plurality of said redundant memory cells to addresses corresponding to said plurality of said defective memory cells to obtain the at least one continuous address range; and the addresses corresponding to said plurality of said defective memory cells being in an operating address range.

8. The configuration according to claim 6, comprising:

a standard memory cell array including said plurality of said functional memory cells and said plurality of said defective memory cells;

said programmable address decoder being for replacing said plurality of said defective memory cells by said plurality of said functional memory cells to obtain the at least one continuous address range.

9. The configuration according to claim 6, comprising:

optically programmable connecting devices for programming said address decoder depending on a test result determining defective addresses.

10. The configuration according to claim 9, wherein: said optically programmable connecting devices can be programmed after the semiconductor memory device has been housed.

11. The configuration according to claim 6, in combination with the semiconductor memory device, wherein: the semiconductor memory device is a DRAM.

12. The configuration according to claim 6, in combination with the semiconductor memory device, wherein: the semiconductor memory device includes a DRAM.

* * * * *